(12) United States Patent
Kim et al.

(10) Patent No.: US 11,133,481 B2
(45) Date of Patent: Sep. 28, 2021

(54) METHOD FOR MANUFACTURING SOLAR CELL

(71) Applicant: LG Electronics Inc., Seoul (KR)

(72) Inventors: Seongtak Kim, Seoul (KR); Seh-Won Ahn, Seoul (KR); Yu Jin Lee, Seoul (KR); Jin-Won Chung, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/764,699

(22) PCT Filed: Oct. 4, 2018

(86) PCT No.: PCT/KR2018/011746
§ 371 (c)(1),
(2) Date: May 15, 2020

(87) PCT Pub. No.: WO2019/098527
PCT Pub. Date: May 23, 2019

(65) Prior Publication Data
US 2021/0175450 A1      Jun. 10, 2021

(30) Foreign Application Priority Data
Nov. 15, 2017   (KR) .................. 10-2017-0152516

(51) Int. Cl.
*H01L 51/42*      (2006.01)
*H01L 51/00*      (2006.01)
(Continued)

(52) U.S. Cl.
CPC ...... *H01L 51/4213* (2013.01); *H01L 51/0008* (2013.01); *H01L 51/0028* (2013.01); *H01L 25/16* (2013.01); *H01L 31/1864* (2013.01)

(58) Field of Classification Search
None
See application file for complete search history.

(56) References Cited

U.S. PATENT DOCUMENTS

2016/0163904 A1    6/2016  Mailoa et al.
2017/0243699 A1*   8/2017  Beaumont ............ H01G 9/2009
(Continued)

FOREIGN PATENT DOCUMENTS

CN    105914296      8/2016
KR    20170097724    8/2017

OTHER PUBLICATIONS

Werner et al., "Perovskite/Silicon Tandem Solar Cells: Challenges Towards High-Efficiency in 4-Terminal and Monolithic Devices," IEEE Xplore, Nov. 5, 2018, 5 pages.
(Continued)

*Primary Examiner* — Benjamin P Sandvik
(74) *Attorney, Agent, or Firm* — Fish & Richardson P.C.

(57) ABSTRACT

The present invention relates to a method for manufacturing: a perovskite solar cell in which the laminated shape and the composition of a perovskite absorbing layer are controlled; and a tandem solar cell comprising the perovskite solar cell, and the perovskite absorbing layer is formed through a method for manufacturing a solar cell, comprising the steps of: forming, on a substrate, an inorganic seed layer conformal with the substrate by using a BO source, an A-doped BO source or an AxOy source and the BO source; and supplying organic halides onto the seed layer, and thus a perovskite thin film having a complex composition conformal with the substrate can be formed such that an effect of enabling light absorption to increase can be achieved.

20 Claims, 14 Drawing Sheets

(51) Int. Cl.
*H01L 25/16* (2006.01)
*H01L 31/18* (2006.01)

(56) References Cited

U.S. PATENT DOCUMENTS

| | | | | |
|---|---|---|---|---|
| 2018/0248052 | A1* | 8/2018 | Seok | H01L 31/022425 |
| 2019/0185495 | A1* | 6/2019 | Cahen | H01L 51/005 |
| 2019/0206630 | A1* | 7/2019 | Choy | H01L 31/032 |
| 2020/0111982 | A1* | 4/2020 | Yu | H01L 51/5012 |
| 2020/0343309 | A1* | 10/2020 | Lee | H01L 31/0504 |

OTHER PUBLICATIONS

Werner et al., "Perovskite/Silicon Tandem Solar Cells: Marriage of Convenience or True Love Story?—An overview," Advanced Materials Interfaces, Sep. 11, 2017, 20 pages.

Albrecht et al., "Towards optical optimization of planar monolithic perovskite/silicon-heterojunction tandem solar cells," Journal of Optics, May 11, 2016, 11 pages.

Chen et al., "Environmentally responsible fabrication of efficient perovskite solar cells from recycled car batteries," Energy & Environmental Science, Oct. 2014, 7(ll):3659-3665.

Deng & Li, "Advances in the Application of Atomic layer deposition for organometal halide perovskite solar cells," Advanced Materials Interfaces, Nov. 2016, 10 pages.

EP Extended European Search Report in European Appln. No. 18877580.3, dated Jul. 14, 2021, 12 pages.

Hu et al., "A review on low dimensional metal halides: Vapor phase epitaxy and physical properties," Journal of Materials Research, Nov. 2017, 32(21):3992-4024.

Lee et al., "Formamidinium and Cesium Hybridization for Photo- and Moisture-Stable Perovskite Solar Cell," Advanced Energy Materials, Oct. 2015, 9 pages.

Petrus et al., "Capturing the Sun: A Review of the challenges and perspectives of perovskite solar cells," Advanced Energy Materials, Aug. 2017, 27 pages.

Zhang et al., "CH3NH3PbI3 converted from reactive magnetron sputtered PbO for large area perovskite solar cells," Solar Energy Materials and Solar Cells, Apr. 2017, 163:250-254.

* cited by examiner

METHOD FOR MANUFACTURING SOLAR CELL

CROSS-REFERENCE TO RELATED APPLICATIONS

This application is a National Stage application under 35 U.S.C. § 371 of International Application No. PCT/KR2018/011746, filed on Oct. 4, 2018, which claims the benefit of Korean Patent Application No. 10-2017-0152516, filed on Nov. 15, 2017. The disclosures of the prior applications are incorporated by reference in their entirety.

TECHNICAL FIELD

The present disclosure relates to a method of manufacturing a solar cell, and more specifically, to a method of manufacturing a perovskite solar cell in which the laminated shape and the composition of a perovskite absorbing layer are controlled, and a method of manufacturing a tandem solar cell including the perovskite solar cell.

BACKGROUND ART

Crystalline silicon (c-Si) solar cells are representative single-junction solar cells and are currently widely used as commercial solar cells.

However, crystalline silicon solar cells have disadvantages in that a manufacturing cost is high and practical photoelectric conversion efficiency is low because a theoretical limitation of conversion efficiency is very low at about 32%.

As new solar cells for overcoming the disadvantages of the crystalline silicon solar cells, perovskite solar cells that use a perovskite light absorbing layer and tandem solar cells which are formed as a single solar cell by connecting single junction solar cells including absorbing layers having different bandgaps are being focused on.

The perovskite solar cell has advantages in that a theoretical limitation of conversion efficiency is about 66%, which is higher than that of other solar cells, and a manufacturing process is simple, and a manufacturing cost is low, and thus economic efficiency is high.

FIG. 1 illustrates a schematic cross section of a two-terminal tandem solar cell, which is a general form, among tandem solar cells.

Referring to FIG. 1, a tandem solar cell is formed so that a single junction solar cell including an absorbing layer having a relatively large bandgap is tunnel functioned to a single-junction solar cell including an absorbing layer having a relatively small bandgap with a junction layer interposed therebetwen.

Among the tandem solar cells, a perovskite and/or crystalline silicon tandem solar cell that uses a single-junction solar cell including an absorbing layer having a relatively large bandgap as a perovskite solar cell can achieve a high photoelectric efficiency of 30% or more and thus is attracted a great deal of attention.

Meanwhile, in a single junction solar cell and a tandem solar cell including a perovskite absorbing layer, it is very important to control a composition of the perovskite absorbing layer. This is because it is possible to control a bandgap and suppress the generation of an unwanted phase (e.g., a delta ($\delta$) phase) by the composition of the perovskite absorbing layer.

In addition, in the tandem solar cell, substrates having a texture shape are mainly used to increase a light absorption rate. When the substrate has a texture as described above, the perovskite absorbing layer formed on the substrate should also have a conformal shape that maintains the texture of the substrate.

However, in the conventional method, a solution method is mainly used as a method of forming a perovskite absorbing layer. The solution method is advantageous in that economic efficiency is high and a process is simple, whereas the solution method is disadvantageous in that it is difficult for the perovskite absorbing layer to be formed due to a specific high leveling property of the solution to maintain a state of conformity to the substrate. As a result, there is a problem in that the texture structure of the substrate cannot be projected onto the perovskite absorbing layer. In addition, there is a limit in increasing a content of bromine (Br) because too much iodine (I) is included in an operation of forming a seed layer.

Meanwhile, a method is also known in which a Pb film is first formed by a reactive sputtering method, which is one of dry methods, and then PbO is formed by reacting $O_2$ and Pb by post-treatment. However, even in this case, the formed PbO has a spherical particle shape, and thus it is difficult to form a conformal perovskite absorbing layer by the above method. In addition, the above method has a limitation in that it is difficult to form a perovskite absorbing layer having a composite composition containing a high melting point component such as Cs.

As described above, in the case of the related art, a reflectivity of incident light is increased because a conformal absorbing layer cannot be formed, and thus a path of light having a long wavelength which is absorbed by a crystalline silicon tandem solar cell is shortened. As a result, there is a problem in that a light absorption rate in the crystalline silicon tandem solar cell is lowered.

DISCLOSURE

Technical Problem

The present disclosure is directed to providing a perovskite solar cell or a tandem solar cell including a perovskite absorbing layer, wherein in order to reduce a reflectivity of vertically incident light and also change a path of the incident light, a conformal inorganic seed layer for a thin film is formed on a substrate with a texture having an uneven structure to increase photoelectric efficiency by allowing the light to enter the solar cell, and thus it is possible to form a structure of a perovskite thin film which conforms to the substrate.

The present disclosure is also directed to providing a perovskite solar cell or a tandem solar cell including a perovskite absorbing layer, wherein a perovskite absorbing layer having a composite composition, which contains a high melting point element such as Cs and in which a content of a halogen element is controllable, is formed.

Technical Solution

One aspect of the present disclosure provides a method of manufacturing the solar cell which includes forming, on a substrate, an inorganic seed layer conforming to the substrate using a BO source, an A-doped BO source, or an $A_xO_y$ source and the BO source, and supplying organic halides onto the inorganic seed layer. Here, A denotes an alkali metal, B denotes a divalent metal cation, and O denotes oxygen.

The source may be a target, and the forming of the inorganic seed layer may be accomplished by sputtering.

The forming of the inorganic seed layer may be accomplished by chemical vapor deposition (CVD) or atomic layer deposition (ALD).

A thickness of the inorganic seed layer may range from 10 to 200 nm.

The organic halide may be an A'X composition. Here, A' denotes +1 monovalent organic ammonium or organic amidinium, and X denotes halogen ions.

The supplying of the organic halides may be accomplished by any one of an evaporation method, a chemical vapor deposition (CVD) method, a physical vapor deposition (PVD) method, and a vapor annealing method.

The supplying of the organic halides may be performed at a substrate temperature of 25 to 200° C. for 120 minutes or less.

The supplying of the organic halides may include supplying the organic halides and converting the organic halides into a perovskite absorbing layer by reaction with the inorganic seed layer.

The method may further include converting the organic halides into a perovskite absorbing layer after the supplying of the organic halides.

In this case, a thickness of the perovskite absorbing layer may range from 50 to 1,000 nm.

In particular, the perovskite absorbing layer may include $FA_{1-x}Cs_xPbBr_yI_{3-y}$ (here, $0 \leq x \leq 1$, $0 \leq y \leq 3$).

The method may further include performing post-heat treatment after the supplying of the organic halides.

In this case, the post-heat treatment may be solvent treatment and may be performed at a temperature of 80 to 200° C. for 120 minutes or less.

In this case, the method may further include forming a first conduction-type charge transport layer before the inorganic seed layer is formed and forming a second conduction-type charge transport layer after the supplying of the organic halides or the converting the organic halides into the perovskite absorbing layer.

The solar cell may include a first solar cell serving as a lower solar cell, and a perovskite solar cell serving as an upper solar cell. A bandgap of the first solar cell may be smaller than a bandgap of the perovskite solar cell.

The solar cell may include a silicon solar cell serving as a lower solar cell, and a perovskite solar cell serving as an upper solar cell. The silicon solar cell may include a substrate, a first conduction layer located on a first surface of the substrate, and a second conduction-type layer located on a second surface of the substrate.

In this case, the silicon solar cell may include a first passivation layer located between the substrate and the first conduction layer, and a second passivation layer located between the substrate and the second conduction layer.

In this case, the substrate and the first conduction layer may have the same semiconductor conduction type.

Alternatively, the substrate and the second conduction layer may have the same semiconductor conduction type.

Advantageous Effects

According to the present disclosure, on a substrate with a texture having an uneven structure, an inorganic seed layer conforming to the substrate is formed, and thus a perovskite solar cell or a tandem solar cell including a perovskite absorbing layer conforming to the substrate can be formed.

As a result, in the perovskite solar cell or the tandem solar cell, it is possible to reduce a reflectivity of vertically incident light and also extend a path of the incident light, and thus a light absorption rate can be increased and photoelectric efficiency can be finally increased.

Meanwhile, in particular, a halogen compound containing iodine (I) is not included in the inorganic seed layer, and thus the likelihood of performance degradation in vacuum deposition equipment can be significantly reduced.

Therefore, it is possible to apply physical vapor deposition or chemical vapor deposition applicable to conformal coating, which results in an advantageous process effect suitable for commercialization and mass production.

In addition, when the inorganic seed layer is formed, a high melting point component, such as Cs, can be included in advance, and a perovskite absorbing layer having a desired composite composition can be formed by controlling components of an organic material layer during a process of supplying organic halides.

Accordingly, an undesired growth, such as a delta phase and the like, can be suppressed, and furthermore, a bandgap of the perovskite absorbing layer can be controlled by controlling the components of the organic material and components of halogen. As a result, the light absorption rate of the incident light can be increased and the photoelectric efficiency can be improved.

MODES OF THE INVENTION

Figure 1:
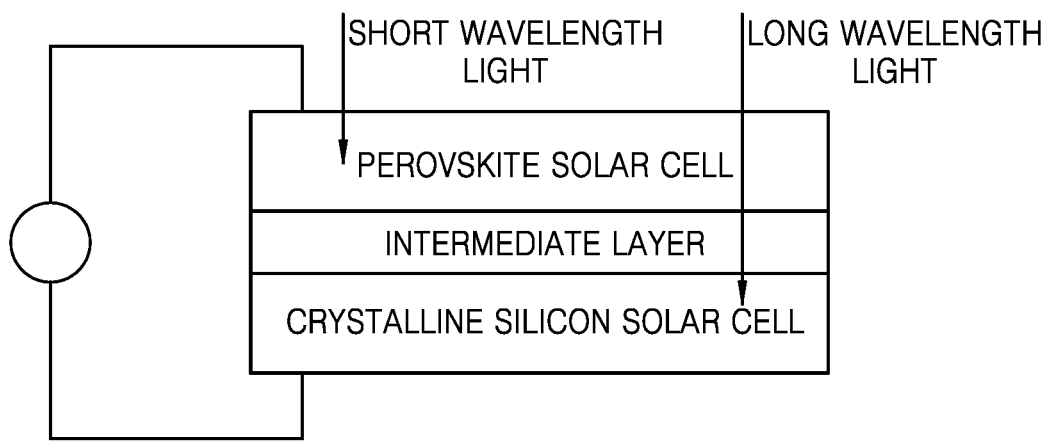
FIG. 1 is a schematic view illustrating a general tandem solar cell.

Hereinafter, a tandem solar cell and a method of manufacturing the same according to exemplary embodiments of the present disclosure will be described in detail with reference to the accompanying drawings.

The present disclosure is not limited to embodiments to be disclosed and may be implemented in various different forms. The embodiments are provided in order to fully explain the present disclosure and the scope of the present disclosure to those skilled in the art.

Parts irrelevant to description are omitted in the drawings in order to clearly explain the embodiments of the present disclosure. The same or similar parts are denoted by the same reference numerals throughout this specification. In addition, some embodiments of the present disclosure will be described in detail with reference to the exemplary accompanying drawings. In this specification, when reference numerals are assigned to components of each drawing, it should be noted that, even when the same components are illustrated in different drawings, the same numerals are assigned to the same components whenever possible. When the embodiments of the present disclosure are described, if it is determined that detailed descriptions of known technology related to the present disclosure unnecessarily obscure the subject matter of the present disclosure, detailed descriptions thereof will be omitted.

In describing components of the present disclosure, terms such as first, second, A, B, (a), and (b) may be used. These terms are used to distinguish one component from another component, but the nature, order, or the number of the components is not limited by these terms. It will be understood that when a component is referred to as being "connected" or "coupled" to another component, it can be directly connected or coupled to another component, intervening components may be present, or it can be connected or coupled to another component through the other component.

In addition, in implementing the present disclosure, components may be subdivided and described for convenience of description, but the components may be implemented in a single device or module or a single component may be implemented by being divided into a plurality of devices or modules.

A method of manufacturing a solar cell in the present disclosure is applicable to both of a perovskite solar cell and a tandem solar cell. In particular, in the tandem solar cell in the present disclosure, the perovskite solar cell may be used as a solar cell having a large bandgap. Therefore, hereinafter, the present disclosure will be described based on the tandem solar cell.

Figure 2:
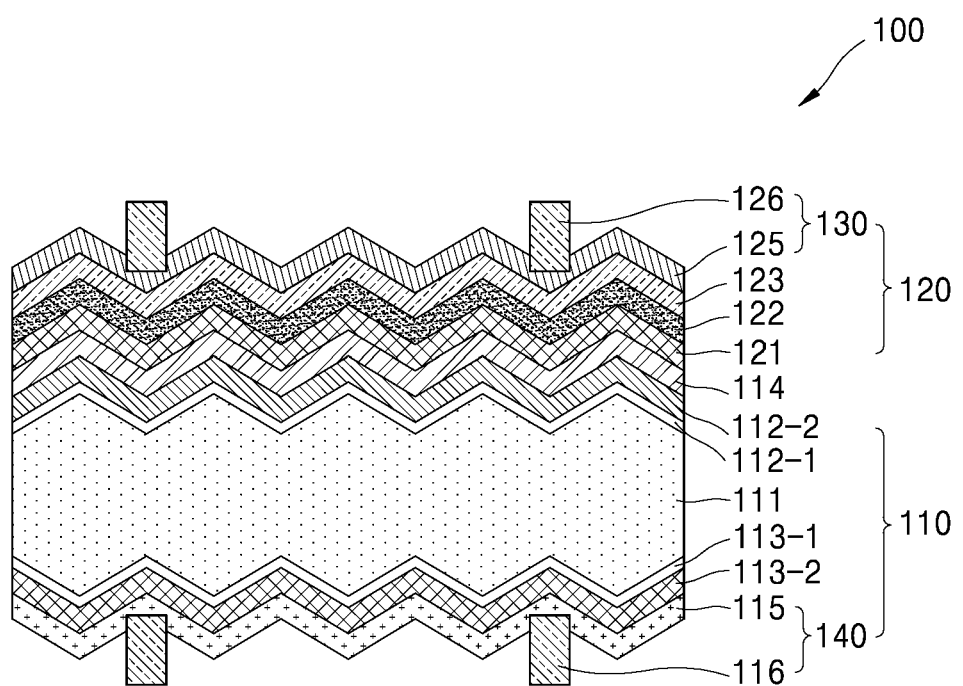
FIG. 2 is a cross-sectional view illustrating a tandem solar cell according to an embodiment of the present disclosure.

FIG. 2 is a cross-sectional view illustrating a tandem solar cell according to an embodiment of the present disclosure.

A tandem solar cell 100 according to the embodiment of the present disclosure has a structure of a two-terminal tandem solar cell formed so that a perovskite solar cell 120 including an absorbing layer having a relatively large bandgap is directly tunnel functioned to a silicon solar cell 110 including an absorbing layer having a relatively small bandgap with an intermediate layer 114 (hereinafter, referred to as a "tunnel junction layer," a "junction layer," or an "inter-layer") interposed therebetwen.

Accordingly, among light incident on the tandem solar cell 100, light in a short wavelength region is absorbed by the perovskite solar cell 120 disposed in an upper portion of the tandem solar cell 100 so that electric charges are generated, and light in a long wavelength region, which passes through the perovskite solar cell 120, is absorbed by the silicon solar cell 110 disposed in a lower portion of the tandem solar cell 100 so that electric charges are generated.

In the tandem solar cell 100 having the above-described structure, the light in a short wavelength region is absorbed by the perovskite solar cell 120 disposed in the upper portion thereof so that electric charges are generated and the light in a long wavelength region is absorbed by the silicon solar cell 110 disposed in the lower portion thereof so that electric charges are generated, and thus a threshold wavelength may be shifted toward the long wavelength. As a result, a wavelength absorption band of the entire solar cell can be widened.

The tandem solar cell 100 according to the embodiment of the present disclosure described above may include the silicon solar cell 110, the perovskite solar cell 120, a junction layer 114, a first electrode 140, and a second electrode 130.

The silicon solar cell 110 in the present disclosure may include a crystalline silicon substrate 111, a second passivation layer 112-1 located on a second surface of the crystalline silicon substrate, a second conduction-type layer 112-2 located on the second passivation layer 112-1, a first passivation layer 113-1 located on a first surface of the crystalline silicon substrate, a first conduction layer 113-2 located on the first passivation layer 113-1, and the first electrode 140 located on the first conduction layer 113-2.

More specifically, the crystalline silicon substrate 111 may be formed of a single crystalline semiconductor or a polycrystalline semiconductor (e.g., single crystalline silicon or polycrystalline silicon). In particular, the crystalline silicon substrate 111 may be formed of a single crystalline semiconductor (e.g., a single crystalline semiconductor wafer, and more specifically, a single crystalline silicon wafer). As described above, when the crystalline silicon substrate 111 is formed of a single crystalline semiconductor (e.g., single crystalline silicon), the silicon solar cell 110 constitutes a single crystalline semiconductor solar cell (e.g., a single crystalline silicon solar cell).

Generally, a single crystalline semiconductor substrate has fewer two-dimensional defects, such as grain boundaries, and fewer one-dimensional defects, such as dislocation, compared to a polycrystalline semiconductor substrate. When the above defects are present inside the crystals, a strain field that interferes with a flow of charge carriers such as electrons is generated around the defects. Therefore, the silicon solar cell 110 formed based on the substrate 111 formed of the single crystalline semiconductor with few defects has higher mobility of charge carriers than the silicon solar cell formed based on the substrate formed of the polycrystalline semiconductor and thus may have excellent electrical properties.

In the present embodiment, an additional doping region is not formed in the substrate 111, and the semiconductor substrate 111 may include only a base region. As described above, when an additional doping region is not formed in the substrate 111, damage to the substrate 111 and an increase in defects, which can occur when the doping region is formed, can be fundamentally prevented so that the substrate 111 can have excellent passivation characteristics. As a result, surface recombination occurring in a surface of the crystalline silicon substrate 111 can be minimized.

Further, in the present embodiment, the substrate 111 may have a conduction type due to being doped with a first conduction-type dopant, which is a base dopant, at a low doping concentration. In this case, the semiconductor substrate 111 may have a lower doping concentration, higher resistance, or lower carrier concentration than an electric field region having the same semiconductor conduction type as the semiconductor substrate 111.

Meanwhile, in the single-junction solar cell, in order to reduce the reflectivity of the incident light from the surface of the single-junction solar cell and extend the path of the light incident on the solar cell, a texture structure is generally introduced on the surface of the single-junction solar cell. Therefore, the texture may also be formed on a surface (at least on a back surface) of the crystalline silicon solar cell of the tandem solar cell 100 in the present disclosure.

The second passivation layer 112-1 is located on the second surface of the crystalline silicon substrate 111 and the first passivation layer 113-1 is formed on the first surface of the crystalline silicon substrate 111. The first surface and the second surface of the crystalline silicon substrate 111 may be passivated by the first passivation layer 113-1 and the second passivation layer 112-1, respectively.

In the present disclosure, although the terms "the first passivation layer 113-1" and "the second passivation layer 112-1" are used, the first passivation layer 113-1 and/or the second passivation layer 112-1 may serve as a tunneling film. That is, the first and second passivation layers 113-1 and 112-1 may act as a type of barrier to electrons and holes so that minority carriers do not pass therethrough and are accumulated on portions adjacent to the first and second passivation layers 113-1 and 112-1 and then only majority carriers having a predetermined level or more of energy pass through each of the first and second passivation layers 113-1 and 112-1. In this case, the majority carriers having the predetermined level or more of energy may easily pass through the first and second passivation layers 113-1 and 112-1 due to tunneling effect. Here, a thickness of each of the passivation layers 113-1 and 112-1 may be smaller than that of each of the first and second conduction-type layers 113-2 and 112-2 to sufficiently implement the tunneling effect.

For example, each of the first and second passivation layers 113-1 and 112-1 may include an intrinsic amorphous semiconductor. For example, each of the first and second passivation layers 113-1 and 112-1 may be made of an intrinsic amorphous silicon (i-a-Si) layer. Since the first and second passivation layers 113-1 and 112-1 include the same semiconductor material as the substrate 111 and have similar properties to the substrate 111, surface properties of the substrate 111 can be improved more effectively. Accordingly, the passivation characteristics can be significantly improved.

Generally, an amorphous silicon (i-a-Si) layer is a material having a higher energy bandgap of about 0.6 to 0.7 eV compared to a crystalline silicon layer having an energy bandgap of about 1.1 eV, and in addition, the amorphous silicon (i-a-Si) layer has an advantage of being formed very thin during a deposition process. As a result, due to such an advantage of the amorphous silicon layer, a light utilization rate can be increased by minimizing a loss of light absorption in the short wavelength region and a high open voltage and electric field effect can be obtained.

Meanwhile, in the case of a heterojunction silicon solar cell having different bandgaps, it is very likely that lattice mismatch occurs between different materials. However, when the amorphous silicon layer is used, the lattice mismatch does not occur because the amorphous lattice is formed without regularity unlike the crystalline lattice. As a result, when the intrinsic amorphous silicon (i-a-Si) layer is deposited on the crystalline silicon substrate, the recombination of the surface of the silicon substrate may be effectively reduced.

It is more preferable that a hydrogenated intrinsic amorphous silicon (i-a-Si:H) layer is used as the intrinsic amorphous silicon layer in the present disclosure. This is because, by hydrogenation reaction, hydrogen may enter the amorphous silicon, thereby reducing a dangling bond of the amorphous silicon and a localized energy state in the energy bandgap.

However, the present disclosure is not limited thereto. Therefore, the first and/or second passivation layers 113-1 and 112-1 may include an intrinsic amorphous silicon carbide (i-a-SiC$_x$) layer or an intrinsic amorphous silicon oxide (i-a-SiO$_x$) layer. The amorphous silicon compound layer may have an improved effect due to a higher energy bandgap compared to the intrinsic amorphous silicon layer but may have a passivation characteristic slightly lower than the intrinsic amorphous silicon (i-a-Si) layer.

A first conduction layer 113-2 having a first conduction type may be formed on the first passivation layer 113-1. In addition, a second conduction layer 112-2 having a second conduction type opposite to the first conduction type may be located on the second passivation layer 112-1.

The first conduction layer 113-2 is a region having a first conduction type that includes a first conduction-type dopant. In addition, the second conduction layer 112-2 is a region having a second conduction type that includes a second conduction-type dopant.

For example, the second conduction layer 112-2 may have the same semiconductor conduction type as the substrate 111 and be in contact with the second passivation layer 112-1, and the first conduction layer 113-2 may have a different conduction type from the substrate 111 and be in contact with the first passivation layer 113-1. In this case, the second conduction layer 112-2 may function as an electric field layer and the first conduction layer 113-2 may function as an emitter layer. Therefore, a structure of the tandem solar cell 100 may be simplified and the tunneling effect of the first and second passivation layers 113-1 and 112-1 may be maximized.

However, the present disclosure is not limited thereto. On the other hand, the second conduction layer 112-2 may have a different conduction type from the substrate 111 and be in contact with the second passivation layer 112-1, and the first conduction layer 113-2 may have the same semiconductor conduction type as the substrate 111 and be in contact with the first passivation layer 113-1. In this case, the first conduction layer 113-2 may function as an electric field layer, and the second conduction layer 112-2 may function as an emitter layer.

Since the first conduction layer 113-2 and the second conduction layer 112-2 are formed on the substrate 111 to be separate from the crystalline silicon substrate 111, the first conduction layer 113-2 and the second conduction layer 112-2 may have a different material and/or crystalline structure from the substrate 111 such that the first conduction layer 113-2 and the second conduction layer 112-2 may be easily formed on the substrate 111.

Meanwhile, each of the first conduction layer 113-2 and the second conduction layer 112-2 may be formed by doping an amorphous semiconductor that can be easily manufactured by various methods, such as deposition, with the first or second conduction-type dopant. Accordingly, the first conduction layer 113-2 and the second conduction layer 112-2 may be easily formed by a simple process. In this case, as described above, when each of the first and second passivation layers 113-1 and 112-1 is formed of the intrinsic amorphous semiconductor (e.g., the intrinsic amorphous silicon), the substrate, the passivation layers, and the conduction-type layers may have excellent adhesive properties, excellent electrical conductivity, and the like.

In this case, examples of a P-type dopant used as the first or second conduction-type dopant may include group 3 elements, such as boron (B), aluminum (Al), gallium (Ga), indium (In), and the like, and examples of an N-type dopant used as the first or second conduction-type dopant may include group 5 elements, such as phosphorus (P), arsenic (As), bismuth (Bi), antimony (Sb), and the like. However, the present disclosure is not limited thereto, and various dopants may be used as the first or second conduction-type dopant.

For example, the substrate 111 and the first conduction layer 113-2 may have an N-type conduction type, and the second conduction layer 112-2 may have a P-type conduction type. Accordingly, the substrate 111 has an N-type conduction type, and thus a lifetime of the carrier may be increased. In this case, the crystalline silicon substrate 111 and the first conduction layer 113-2 may include phosphorus (P) as the N-type dopant, and the second conduction layer 112-2 may include boron (B) as the P-type dopant.

However, the present disclosure is not limited thereto, and the substrate 111 and the first conduction layer 113-2 may have a P-type conduction type and the second conduction layer 112-2 may have an N-type conduction type.

Alternatively, the substrate 111 and the second conduction layer 112-2 may have an N-type conduction type, and the first conduction layer 113-2 may have a P-type conduction type.

In the present embodiment, each of the first conduction layer 113-2 and the second conduction layer 112-2 may include at least one of an amorphous silicon (a-Si) layer, an amorphous silicon oxide (a-SiO$_x$) layer, an amorphous silicon carbide (a-SiC$_x$) layer, an indium-gallium-zinc oxide (IGZO) layer, a titanium oxide (TiO$_x$) layer, a molybdenum oxide (MoO$_x$) layer, and a polycrystalline silicon (Si) layer.

In this case, the amorphous silicon (a-Si) layer, the amorphous silicon oxide (a-SiO$_x$) layer, the amorphous silicon carbide (a-SiC$_x$), or the polycrystalline silicon (polycrystalline Si) layer, which is applied to each of the first conduction layer 113-2 and the second conduction layer 112-2, may be doped with the first or second conduction-type dopant.

The indium-gallium-zinc oxide layer, the titanium oxide layer, or the molybdenum oxide layer, which is applied to each of the first conduction layer 113-2 and the second conduction layer 112-2, does not include a group 3 element or a group 5 element (e.g., boron or phosphorus) used as the first or second conduction-type dopant except for the materials included in the oxide layer. The indium-gallium-zinc oxide layer, the titanium oxide layer, or the molybdenum oxide layer may selectively collect electrons or holes by itself to perform the same role as the N-type or P-type conductive region. More specifically, the indium-gallium-zinc oxide layer may have an N-type conduction type, the titanium oxide layer may have an N-type conduction type, and the molybdenum oxide layer may have a P-type conduction type.

Although a crystalline structure of the amorphous silicon (a-Si) layer, the amorphous silicon oxide (a-SiO$_x$) layer, or the amorphous silicon carbide (a-SiC$_x$) layer is different from that of the crystalline silicon substrate 111, the amorphous silicon (a-Si) layer, the amorphous silicon oxide (a-SiO$_x$) layer, or the amorphous silicon carbide (a-SiC$_x$) layer may include the semiconductor material (e.g., silicon) constituting the substrate 111 and thus may have similar properties to the substrate 111. Accordingly, as in the first and second passivation layers 113-1 and 112-1, differences in characteristics that may occur in the case of including a material different from the semiconductor material of the substrate 111 may be minimized. Among the above layers, the amorphous silicon oxide layer and the amorphous silicon carbide layer may have a high energy bandgap so that energy band bending may be sufficiently caused to selectively pass the carrier. Further, the indium-gallium-zinc oxide (IGZO) layer, the titanium oxide (TiO$_x$) layer, and the molybdenum oxide (MoO$_x$) layer may have a high energy bandgap and a low light absorption rate, thereby minimizing light loss.

For example, among the first conduction layer 113-2 and the second conduction layer 112-2, the conduction-type layer, which has the same semiconductor conduction type as the substrate and functions as an electric field layer, may include at least one of the indium-gallium-zinc oxide layer, the titanium oxide layer, and the molybdenum oxide layer, which has a low light absorption rate. Accordingly, the absorption of the light by the electric field layer can be minimized.

Further, among the first conduction layer 113-2 and the second conduction layer 112-2, the conduction-type layer, which has a different conduction type from the substrate and functions as an emitter layer, may include at least one of the amorphous silicon layer, the amorphous silicon oxide layer, and the amorphous silicon carbide layer. Since the emitter layer is a layer which is directly involved in photoelectric conversion by forming a p-n junction (or a pin junction having a passivation layer as an intermediate layer) with the substrate 111, the emitter layer may be allowed to include the same semiconductor material (i.e., silicon) as the substrate 111 and have similar characteristics to the substrate 111, and thus the carriers may be moved more effectively.

Referring again to FIG. 2, the first electrode 140 electrically connected to the silicon solar cell is located on (e.g., is in contact with) the first conduction layer 113-2. First, the first electrode 140 may optionally include a transparent electrode layer 115 located on the first conduction layer 113-2. Examples of a material of the transparent electrode layer include transparent conductive oxides, such as indium tin oxide (ITO), zinc indium tin oxide (ZITO), zinc indium oxide (ZIO), zinc tin oxide (ZTO), and the like.

After the transparent electrode layer 115 is located, a grid electrode 116 may be located on the transparent electrode layer 115. Of course, the grid electrode 116 may be located directly on the first conduction layer 113-2 without forming the transparent electrode layer 115. However, since the first conduction layer has a relatively low carrier mobility in collecting carriers using a metal grid, it is more preferable to first form the transparent electrode layer 115.

A paste for the grid electrode 116 of the first electrode 140 in the present disclosure may or may not include a glass frit.

The tandem solar cell 100 in the present disclosure includes the perovskite solar cell 120 on the silicon solar cell 110 as well as the silicon solar cell 110.

First, the perovskite solar cell 120 in the present disclosure includes, for example, a first conduction-type charge transport layer 121 located on the silicon solar cell, a perovskite absorbing layer 122 located on the first conduction-type charge transport layer, a second conduction-type charge transport layer 123 located on the perovskite absorbing layer 122, and a second electrode 130 located on the second conduction-type charge transport layer.

As a specific example, when the crystalline silicon substrate 111 is an N-type single crystalline silicon substrate and the second conduction layer 112-2 has a P-type conduction type, the first conduction-type charge transport layer 121 of the perovskite solar cell 120 becomes an N-type electron transport layer 121 and the second conduction-type charge transport layer 123 becomes a P-type hole transport layer 123.

As another example, when the crystalline silicon substrate 111 is an N-type single crystalline silicon substrate and the second conduction layer 112-2 has an N-type conduction type, the first conduction-type charge transport layer 121 of the perovskite solar cell 120 becomes a P-type hole transport layer 121 and the second conduction-type charge transport layer 123 becomes an N-type electron transport layer 123.

A conductive inorganic material layer may be used as a representative material that can be used as the material of the first conduction-type charge transport layer 121 and the second conduction-type charge transport layer 123 in the present disclosure.

In this case, non-limiting examples when the conductive inorganic material layer is used as an electron transport layer include Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, SrTi oxide, and the like. More preferably, at least one type of metal oxide selected from among ZnO, TiO$_2$, SnO$_2$, WO$_3$, and TiSrO$_3$ may be used as the electron transport layer.

On the other hand, when the conductive inorganic material layer is used as a hole transport layer, the metal oxides usable as the conductive inorganic material layer may include one or more metal oxides selected from among $MoO_x$, NiO, $WO_3$, CuSCN, CuI, CuO, $Cu_2O$, and $VO_x$.

Meanwhile, a layer including silicon (Si) may also be used as the first conduction-type charge transport layer 121 and the second conduction-type charge transport layer 123 in the present disclosure.

For example, when the first conduction-type charge transport layer 121 or the second conduction-type charge transport layer 123 is an N-type electron transport layer, the electron transport layer made of the layer including silicon (Si) is made of, more specifically, a material containing one or more materials from among amorphous silicon (n-a-Si), amorphous silicon oxide (n-a-SiO), amorphous silicon nitride (n-a-SiN), amorphous silicon carbide (n-a-SiC), amorphous silicon oxynitride (n-a-SiON), amorphous silicon carbonitride (n-a-SiCN), amorphous silicon germanium (n-a-SiGe), microcrystalline silicon (n-uc-Si), microcrystalline silicon oxide (n-uc-SiO), microcrystalline silicon carbide (n-uc-SiC), microcrystalline silicon nitride (n-uc-SiN), and microcrystalline silicon germanium (n-uc-SiGe).

On the other hand, when the first conduction-type charge transport layer 121 or the second conduction-type charge transport layer 123 is a P-type hole transport layer, the hole transport layer made of the layer including silicon (Si) is made of, more specifically, a material containing one or more materials from among amorphous silicon (p-a-Si), amorphous silicon oxide (p-a-SiO), amorphous silicon nitride (p-a-SiN), amorphous silicon carbide (p-a-SiC), amorphous silicon oxynitride (p-a-SiON), amorphous silicon carbonitride (p-a-SiCN), amorphous silicon germanium (p-a-SiGe), microcrystalline silicon (p-uc-Si), microcrystalline silicon oxide (p-uc-SiO), microcrystalline silicon carbide (p-uc-SiC), microcrystalline silicon nitride (p-uc-SiN), and microcrystalline silicon germanium (p-uc-SiGe).

The perovskite absorbing layer 122 is located on the first conduction-type charge transport layer 121.

The perovskite absorbing layer 122 is a photoactive layer containing a compound having a perovskite structure, wherein the perovskite structure may be represented by $ABX_3$ (here, A denotes one or more monovalent organic ammonium cations, organic amidinium cations, or metal cations, and B denotes a divalent metal cation, and X denotes a halogen anion).

The perovskite layer in the present disclosure may include a methylamminium (MA) component or a formamidinium (FA) component. More specifically, in the perovskite absorbing layer represented by $ABX_3$, A may include one or more from among the +1 monovalent $C_{1-20}$ alkyl group, the amine group substituted alkyl group, organic amidium, and alkali metal, B may include one or more from among $Pb^{2+}$, $Sn^{2+}$, $Cu^{2+}$, $Ca^{2+}$, $Sr^{2+}$, $Cd^{2+}$, $Ni^{2+}$, $Mn^{2+}$, $Fe^{2+}$, $Co^{2+}$, $Pd^{2+}$, $Ge^{2+}$, $Yb^{2+}$, and $Eu^{2+}$ and X may include one or more from among $F^-$, $Cl^-$, $Br^-$, and $I^-$.

Non-limiting examples of the compound having the perovskite structure include $CH_3NH_3PbI_3$, $CH_3NH_3PbI_xCl_{3-x}$, $CH_3NH_3PbI_xBr_{3-x}$, $CH_3NH_3PbCl_xBr_{3-x}$, $HC(NH_2)_2PbI_3$, $HC(NH_2)_2PbI_xCl_{3-x}$, $HC(NH_2)_2PbI_xBr_{3-x}$, $HC(NH_2)_2PbCl_xBr_{3-x}$, $(CH_3NH_3)(HC(NH_2)_2)_{1-y}PbI_3$, $(CH_3NH_3)(HC(NH_2)_2)_{1-y}PbI_xCl_{3-x}$, $(CH_3NH_3)(HC(NH_2)_2)_{1-y}PbI_xBr_{3-x}$, or $(CH_3NH_3)(HC(NH_2)_2)_{1-y}PbCl_xBr_{3-x}$ ($0 \leq x$, $y \leq 1$).

In particular, in the case of FA of the organic amidinium, it is more preferable that some of A components include alkali metals, particularly, Cs and Rb. This is because the FA-based perovskite absorbing layer has a higher temperature stability than that of the MA-based perovskite absorbing layer and may suppress the generation of an undesired FA-based compound having a delta (δ) phase, particularly due to the addition of Cs.

Until now, it is known that a bandgap of $MAPbI_3$ used as a representative perovskite (absorbing) layer ranges from about 1.55 to 1.6 eV. On the other hand, it is known that a bandgap of an FA-based perovskite absorbing layer used as another perovskite absorbing layer is smaller than that of the MA-based perovskite absorbing layer. For example, the bandgap of FAPbI3 is about 1.45 eV.

Meanwhile, the addition of Br may make the bandgap of the FA-based perovskite absorbing layer increase to be similar to the bandgap of the existing MA-based perovskite absorbing layer.

When the bandgap energy is increased in a high range, the perovskite layer having a high bandgap absorbs light having a short wavelength as compared to the existing silicon solar cell, and thus a thermal loss caused by a difference between the photon energy and the bandgap may be reduced and a high voltage may be generated. As a result, finally, the efficiency of the solar cell may be increased.

In the present disclosure, in order to form the perovskite (absorbing) layer, an inorganic seed layer conforming to the substrate is formed using a BO source, an A-doped BO source, or an $A_xO_y$ source and the BO source. Here, A denotes an alkali metal, B denotes a divalent metal cation, and O denotes oxygen. In this case, the component, such as A, B, or the like, is one of the components constituting the perovskite absorbing layer having a composition such as $ABX_3$.

It is preferable that solution methods (e.g., a spin coating method, a dip coating method, a spraying method, a plating spinning coating method, a slot die method, a printing method, etc.) which are commonly used to form an inorganic seed layer be excluded.

This is because the above solution methods have high levelling properties due to the nature of the material called a solution and the levelling property makes final films formed by the solution flat, regardless of the shape of the substrate to which the solution is applied.

It is preferable that the inorganic seed layer in the present disclosure maintain a state of conformity to the substrate having a texture shape. This is because, when the substrate has a texture shape, the reflectivity of the light incident perpendicularly to the solar cell is reduced and at the same time the path of the incident light is changed so that the light enters the solar cell, thereby increasing the photoelectric efficiency.

Therefore, in the present disclosure, a process of forming the inorganic seed layer is preferably performed using a physical deposition or chemical deposition method such as a thermal vapor deposition method, a sputtering method, a chemical deposition method, or the like.

The composition of the inorganic seed layer and the sources in the present disclosure do not contain a component such as iodine (I) and most of which has a composition of oxides. Since the composition of the inorganic seed layer of the present disclosure does not contain components particularly harmful to the deposition equipment, the deposition method is more preferable.

In particular, it is more preferable to use sputtering as the process of forming the inorganic seed layer. When the sputtering is used, the sources are supplied in the form of a target.

In this case, the sputtering has an additional advantage as compared to other physical deposition methods such as thermal vapor deposition. As described above, the perovskite absorbing layer has a composite composition composed of various components to improve additional properties. In particular, the FA-based perovskite absorbing layer should contain a metal component such as Cs, to suppress the delta ($\delta$) phase. However, metals or compounds, such as Cs, $Cs_2O$, CsI, and the like, containing a Cs component have a relatively high melting point. Therefore, in order to contain a Cs component together with other components using the thermal deposition method, it is difficult to control the components or the composition in the inorganic seed layer due to different vapor pressures. However, when the sputtering is used, deposition is performed by a physical deposition method using a target having a composite composition having a desired composition, and thus it has an advantage of easily forming a film with a desired composition.

Figure 3:
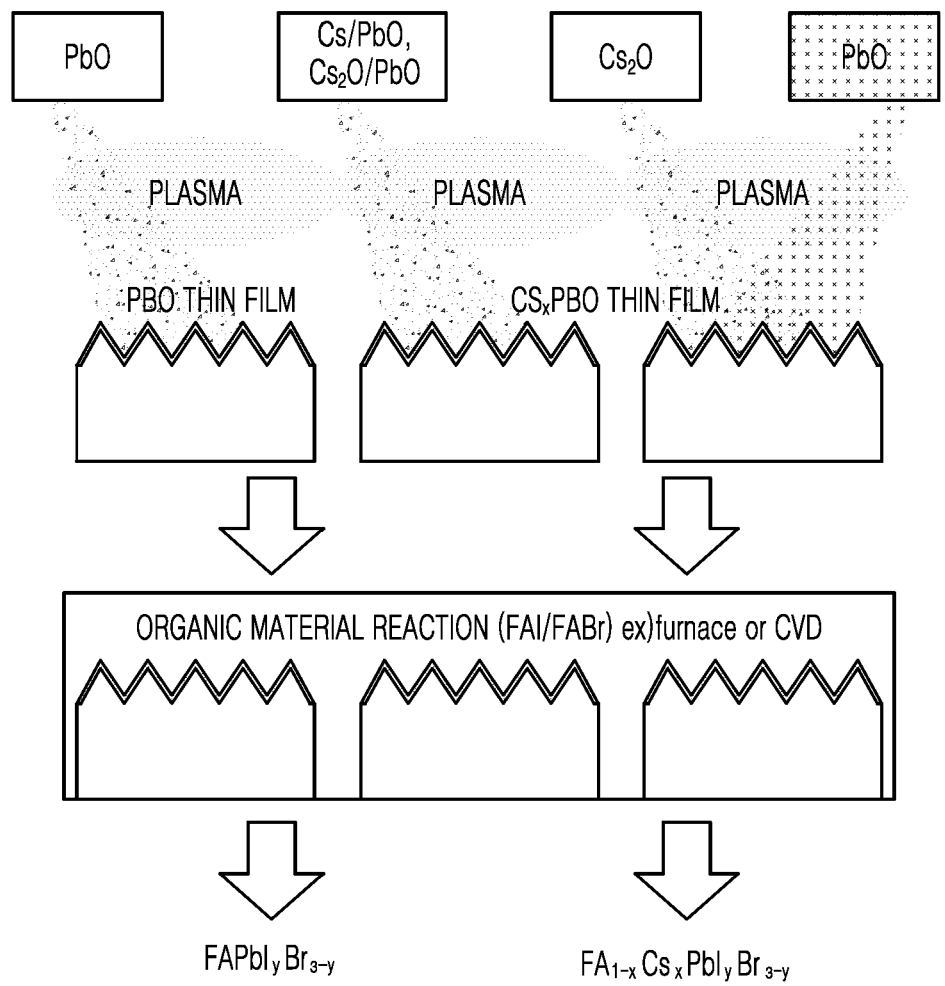
FIG. 3 is an exemplary view illustrating a method of manufacturing a perovskite absorbing layer according to an embodiment of the present disclosure.

In a sputtering method in the present disclosure, as illustrated in FIG. 3, a BO target, an A-doped BO target, or a co-target of $A_xO_y$ and BO may be used. More specifically, a PbO target, a PbO target (e.g., a Cs/PbO target or a $Cs_2O$/PbO target) doped with Cs, or a co-target of $Cs_2O$ and PbO may be used.

More specifically, first, an inorganic seed layer having a PbO composition may be formed using a PbO target by sputtering. Alternatively, an inorganic seed layer having a $Cs_xPbO$ composite composition may be formed using a PbO target (e.g., a Cs/PbO target or a $Cs_2O$/PbO target) doped with Cs by sputtering. Alternatively, an inorganic seed layer having a $Cs_xPbO$ composite composition may be formed using two targets, $Cs_2O$ and BO, as a co-target by sputtering.

Meanwhile, unlike the above, the inorganic seed layer may be formed by a chemical deposition method. For example, the inorganic seed layer may be deposited using a chemical vapor deposition (CVD) method or an atomic layer deposition (ALD) method.

In this case, a thickness of the formed inorganic seed layer is preferably in a range of 10 to 200 nm.

When the thickness of the inorganic seed layer is smaller than 10 nm, the final thickness of the formed perovskite absorbing layer is excessively small such that light absorption does not occur sufficiently, thereby resulting in a decrease in photoelectric conversion efficiency.

On the other hand, when the thickness of the inorganic seed layer is greater than 200 nm, conversion to the final perovskite absorbing layer to be formed is not complete or damage to the perovskite absorbing layer occurs during the conversion so that light absorption does not occur effectively, thereby resulting in a decrease in photoelectric conversion efficiency.

Next, an organic halide of an A'X composition is supplied onto the inorganic seed layer. Here, the A' or X component is one of the components constituting the perovskite absorbing layer having a composite composition such as $A'ABX_3$, wherein A' denotes +1 monovalent organic ammonium or organic amidinium, and X denotes halogen ions.

In the present disclosure, any one of an evaporation method, a CVD method, a physical vapor deposition (PVD) method, and a vapor annealing method is preferably used in the process of supplying the organic halides.

However, the solution methods (e.g., a spin coating method, a dip coating method, a spraying method, a plating spinning coating method, a slot die method, a printing method, etc.) are not preferable. This is because, when the organic halides are formed on the inorganic seed layer by the solution method, a flat organic halide layer is formed on the inorganic seed layer formed conforming to the substrate having a texture shape so that the finally formed perovskite absorbing layer is likely to have a flat shape.

In particular, as illustrated in FIG. 3, it is preferable to cause the inorganic seed layer to react in an organic halide atmosphere by the method such as an evaporation method, a vapor annealing method, or a CVD method. In particular, in the present disclosure, for example, by causing the inorganic seed layer to react using an organic material of a FABr component or a FAI+FABr component, a composition ratio of halogen components in the perovskite absorbing layer may be easily controlled.

In this case, the process of supplying the organic halides is preferably performed at a substrate temperature of 25 to 200° C. for 120 minutes or less.

When the substrate temperature is maintained at a temperature lower than 25° C., the organic halides cannot be sufficiently absorbed into the inorganic seed layer in a gaseous stat due to the very low temperature.

On the other hand, when the substrate temperature is higher than 200° C., the organic halides react on a surface of the inorganic seed layer so that the likelihood of thermal decomposition of the formed perovskite crystal is increased due to the very high temperature when the perovskite crystal is formed.

Meanwhile, in terms of the process time, it is preferable that the process is performed as soon as possible, economically or in terms of soundness of the perovskite. In particular, when the process time is greater than 120 minutes, the unit process time is too long, which is economically undesirable and also increases the likelihood that the formed perovskite crystals are decomposed.

Further, the conversion to the perovskite absorbing layer may occur during the process of supplying the organic halides or, alternatively, may be caused by a separate conversion heat treatment process.

When the process of supplying the organic halides is performed by an evaporation method or a vapor annealing method using a furnace or the like, the perovskite absorbing layer may be formed during the process of supplying the organic halides.

On the other hand, when the process of supplying the organic halides is performed by a CVD method or a PVD method, the perovskite absorbing layer is not completely converted during the process of supplying the organic halides under the process conditions in which the substrate temperature is low, and thus conversion heat treatment for perovskite formation may be additionally performed. In this case, conditions of the conversion heat treatment process are commonly used in the art to which the present disclosure pertains, and conditions that do not cause thermal decomposition of the perovskite absorbing layer are applied.

As described above, the perovskite absorbing layer finally formed by supplying the organic halides onto the inorganic seed layer preferably has a thickness of 50 to 1,000 nm. The thickness of the perovskite absorbing layer preferably ranges from 200 to 600 nm.

When the thickness of the perovskite thin film is smaller than 50 nm, the thickness of the formed perovskite absorbing layer is too small such that light absorption does not occur sufficiently, thereby resulting in a decrease in photoelectric conversion efficiency.

On the other hand, when the thickness of the perovskite absorbing layer is greater than 1,000 nm, conversion to perovskite crystals is not complete or the likelihood of damage to perovskite crystals during the conversion is increased in the formed perovskite absorbing layer. In other words, the integrity of the perovskite crystals in the perovskite absorbing layer is not excellent.

In the present disclosure, by the unique method of the present disclosure, it is possible to control the composition of the perovskite absorbing layer to be a composite composition. Specifically, when using an FA component, it is possible to control a composite composition such as $FA_{1-x}Cs_xPbBr_yI_{3-y}$ (here, $0 \le x \le 1$, $0 \le y \le 3$).

In terms of the shape of the perovskite absorbing layer in the present disclosure, the perovskite absorbing layer may have a shape conforming to the substrate, and thus a light path can extend and a light absorption rate can be improved.

In addition, in terms of composition, the perovskite absorbing layer in the present disclosure may include a high melting point component such as Cs, and thus the bandgap of the perovskite absorbing layer can be controlled by suppressing the formation of the delta shape and controlling a ratio of I and Br.

Meanwhile, in the present disclosure, a post-heat treatment process may be performed after the process of supplying the organic halides.

The post-heat treatment process is preferably a solvent treatment process.

More specifically, the post-heat treatment process is preferably a treatment process in which a polar solvent (e.g., DMF, NMP, DMSO, GBL, etc.) flows in a chamber, preferably in the chamber in which an atmosphere is controllable.

The perovskite crystals have a grain structure or a domain structure. However, grain boundaries or domain boundaries are thermodynamically unstable regions. Therefore, when the solvent treatment is performed, the mobility of atoms or molecules forming the perovskite crystals is increased so that the atoms or molecules are moved to a thermodynamically stable position by the solvent treatment. As a result, the size of grains or domains of the perovskite crystal is increased after the solvent treatment.

This means that defect regions such as grain boundaries or domain boundaries are reduced due to the post-heat treatment. As a result, electrons or holes generated due to the light absorption in the perovskite absorbing layer may be easily moved and parasitic absorption may be decreased, thereby resulting in an increase in photoelectric conversion efficiency.

In this case, the post-heat treatment process is preferably performed at a temperature of 80 to 200° C. for 120 minutes or less.

When the post-heat treatment temperature is maintained at a temperature lower than 80° C., diffusion does not occur sufficiently due to the very low temperature so that the original function of heat treatment cannot be performed.

On the other hand, when the post-heat treatment temperature is greater than 200° C., the likelihood that the perovskite crystals are thermally decomposed is increased due to the very high temperature.

The second conduction-type charge transport layer 123 is located on the perovskite absorbing layer 122, and the second electrode 130 is located on the second conduction-type charge transport layer.

In this case, first, the second electrode 130 may include a transparent electrode layer 125. The transparent electrode layer 125 is formed on an entirety of an upper surface of the perovskite solar cell 120 and serves to collect the electric charges generated in the perovskite solar cell 120. The transparent electrode layer 125 may be implemented as various transparent conductive materials. As the transparent conductive materials, the same material as the transparent conductive material of the intermediate layer 114 may be used.

Next, a grid electrode 126 is located on the transparent electrode layer 125 and disposed on a part of the transparent electrode layer 125.

The grid electrode 126 of the second electrode 130 may be manufactured by selectively applying a second electrode paste not containing a glass frit and then low-temperature sintering the glass frit at a first temperature. Here, the second electrode paste may include metal particles and an organic material that is a binder for low-temperature sintering, and the second electrode paste does not include a glass frit. In particular, the first temperature may be 250° C. or less, and more specifically, may range from 100 to 200° C.

The grid electrode 116 of the first electrode and the grid electrode 126 of the second electrode may be simultaneously formed when the second electrode 130 is formed, or the second electrode 130 may be formed after the perovskite solar cell is formed after the first electrode 140 is formed. When the grid electrode 116 of the first electrode and the grid electrode 126 of the second electrode are simultaneously formed, both of the first electrode 140 and the second electrode 130 are formed by low-temperature sintering at a temperature of 250° C. or less.

Method of Manufacturing Tandem Solar Cell

FIGS. 4 to 14 are cross-sectional views sequentially illustrating a method of manufacturing a tandem solar cell according to an embodiment of the present disclosure.

In order to manufacture the tandem solar cell in the present disclosure, first, a crystalline silicon solar cell is provided.

Figure 4:
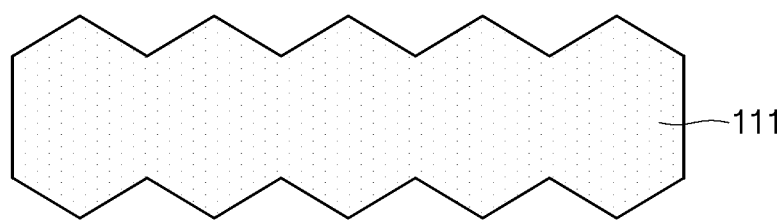
FIGS. 4 to 14 are process cross-sectional views illustrating a method of manufacturing a tandem solar cell according to an embodiment of the present disclosure.

More specifically, as illustrated in FIG. 4, first, a front surface and a rear surface of a crystalline silicon substrate 111 are planarized, and then a texturing pattern is formed by texturing at least one of the front surface and the rear surface as necessary.

In this case, any one of a wet chemical etching method, a dry chemical etching method, an electrochemical etching method, and a mechanical etching method may be used to introduce a texture structure of the crystalline silicon substrate 111, but the present disclosure is not limited thereto. For example, the texture structure may be introduced by etching at least one of a first surface and a second surface of the crystalline silicon substrate 111 in a basic aqueous solution.

As a specific example, first, in the present disclosure, an N-type single crystalline silicon substrate having a thickness of several tens to hundreds of μm sliced along a {100} surface is provided. Next, a surface of the substrate is etched using an aqueous solution containing additives such as organic solvents, phosphates, reaction regulators, and/or surfactants in an aqueous solution of sodium hydroxide (NaOH) or potassium hydroxide (KOH) at 1 to 5% by weight in a temperature range of room temperature to 150° C.

The organic solvent may be at least one from among 2-methyl-2,4-pentanediol, propylene glycol, 2,2,4-trimethyl-1,3-pentanediol, 1,3-butanediol, 1,4-butanediol, 1,6-hexanediol, 2,2-dimethyl-1,3-propanediol, hydroquinone, 1,4-cyclohexanediol, and N-methyl proline.

The phosphate may be at least one of $K_3PO_4$ and $K_2HPO_4$.

A texture having pyramid-shaped uneven portions is formed on the single crystalline silicon substrate by the etching. Since the single crystalline silicon has a diamond cubic structure, a {111} surface is the closet surface and is also a chemically stable surface. Therefore, the {111} surface has the slowest etching rate with respect to the aqueous sodium hydroxide solution, and as a result, the silicon substrate is anisotropic etched along the {111} surface after the etching. As a result, a texture having a depth of about 0.1 to 10 μm is uniformly formed on an entirety of the silicon substrate.

Figure 5:
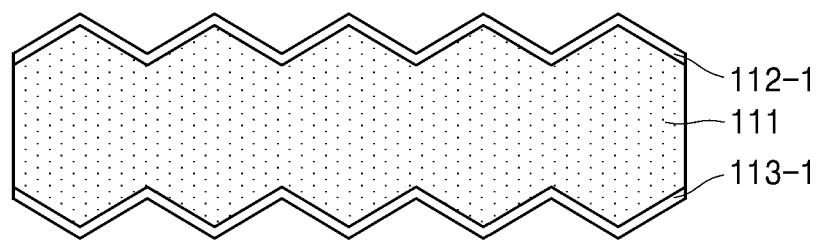

Next, as illustrated in FIG. 5, a first passivation layer 113-1 and a second passivation layer 112-1 are formed on the first surface and the second surface of the crystalline silicon substrate 111, respectively.

In the case of a heterojunction silicon solar cell, first, amorphous intrinsic silicon (i-a-Si:H) layers are deposited on both surfaces of the N-type crystalline silicon substrate 111 having a uniform texture with the passivation layers 112-1 and 113-1 by a plasma-enhanced chemical vapor deposition (PECVD) method using a silicon source material (e.g., $SiH_4$, $Si_2H_6$, etc.) and hydrogen ($H_2$). The PECVD method has an advantage of lowering a process temperature as compared to a general CVD method and is particularly preferable as a method of manufacturing a heterojunction silicon solar cell.

Figure 6:
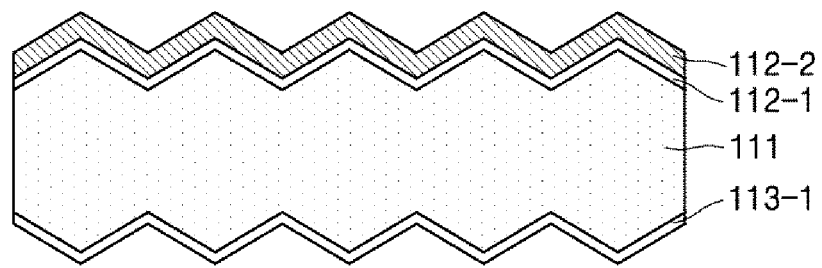
Figure 7:
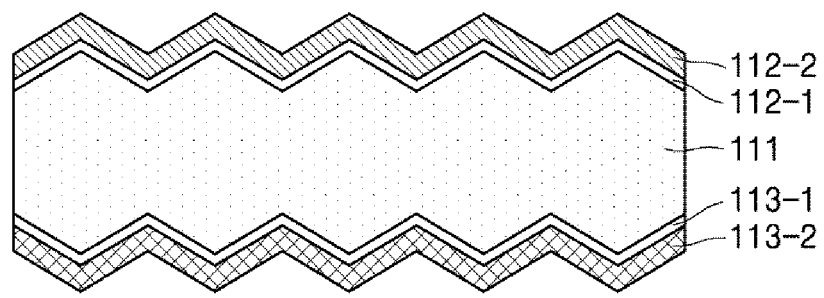

Next, a first conduction layer 113-2 doped with impurities having a conduction type identical or opposite to that of the crystalline silicon substrate 111 and a second conduction layer 112-2 doped with impurities having a conduction type opposite to that of the first conduction layer 113-2 are formed (see FIGS. 6 and 7). In this case, the first conduction layer 113-2 and the second conduction layer 112-2 may be formed in any order.

Specifically, using a PECVD process, one or more gases selected from the group consisting of $SiH_4$, $Si_2H_6$, $SiHCl_3$, and $SiH_2Cl_2$, $H_2$ gas, and $B_2H_6$ or $PH_3$ gas as a dopant gas are used as reactants. In this case, temperature and pressure conditions of the PECVD process are the same as those of a PECVD process of an amorphous intrinsic silicon layer.

Unlike the above example, when the silicon solar cell 110 is a homojunction silicon solar cell, an emitter layer and an electric field layer may be formed by an implant process without the passivation layers 112-1 and 113-1. In this case, when the substrate is doped with an N-type impurity, the emitter layer is doped with boron as an impurity and the electric field layer is doped with phosphorous as an impurity.

Figure 8:
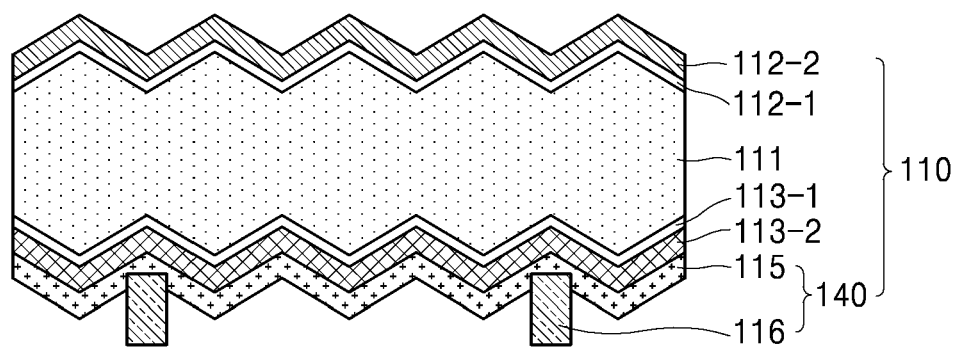

Next, as illustrated in FIG. 8, a first electrode 140 including a transparent electrode layer 115 and a grid electrode 116 is formed on the first conduction layer 113-2 of the crystalline silicon substrate 111.

In the case of the heterojunction silicon solar cell, as described above, in order to prevent the destruction of hydrogen bonds inside the amorphous silicon, a process temperature of the first electrode 140 (more specifically, the grid electrode 116) is limited to 250° C. or less, like a process temperature of the second electrode 130 (more specifically, a grid electrode 126). Therefore, in this case, the first electrode 140 may be formed before the second electrode 130 is formed, or the first electrode 140 and the second electrode 130 may be formed simultaneously.

In the first electrode 140, the transparent electrode layer 115 is first formed on the first conduction layer 113-2. When a transparent conductive oxide, such as ITO, ZITO, ZIO, ZTO, or the like is used as the material of the transparent electrode layer, the transparent electrode layer 115 may be deposited by sputtering.

After the transparent electrode layer 115 is formed, the grid electrode 116 is formed. Of course, the grid electrode 116 may be formed directly on the first conduction layer 113-2 without forming the transparent electrode layer 115. However, it is more preferable to form the transparent electrode layer 115 because the amorphous silicon has a relatively low carrier mobility in collecting carriers using a metal grid.

In this case, the grid electrode 116 prints a first electrode paste on the transparent electrode layer 115 by a screen printing method and is formed by heat treatment having a first temperature (e.g., 250° C. or less, which is, more specifically, a range of 100 to 200° C. and the same as a second temperature).

Alternatively, in the case of the homojunction silicon solar cell, the first electrode 140 and the second electrode 130 are not simultaneously formed, and a process of forming the first electrode 140 by a high-temperature sintering process at a temperature of 700° C. or more and a process of forming the second electrode 130 by low-temperature sintering at a temperature of 250° C. using a second electrode paste not containing a glass frit may be performed separately.

Figure 9:
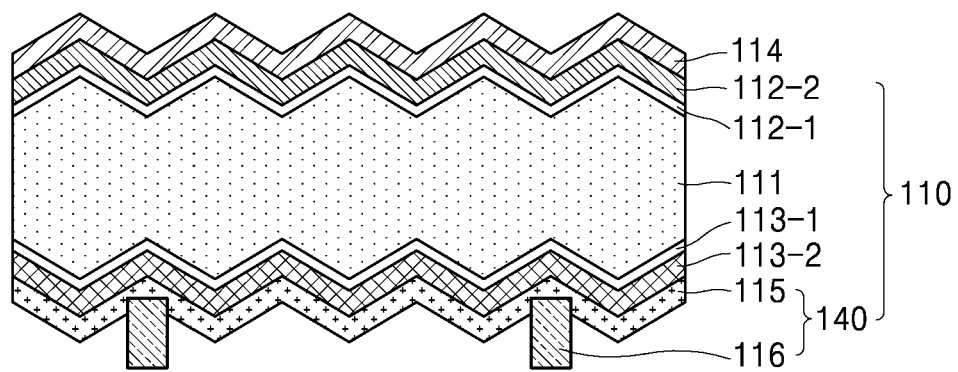

An intermediate layer 114 is formed on the crystalline silicon solar cell 110 (see FIG. 9).

In the present disclosure, the intermediate layer is formed as a beta film on the second conduction layer 112-2 using a generally well-known sputtering method, more specifically, a radio frequency (RF) magnetron sputtering method. In the present disclosure, fluorine tin oxide (FTO) or aluminum doped zinc oxide (AZO) is used for forming the intermediate layer 114, but the present disclosure is not limited to the above material. In addition to the above materials, various types of transparent conductive oxides, metallic materials, or conductive polymers may also be used.

Figure 10:
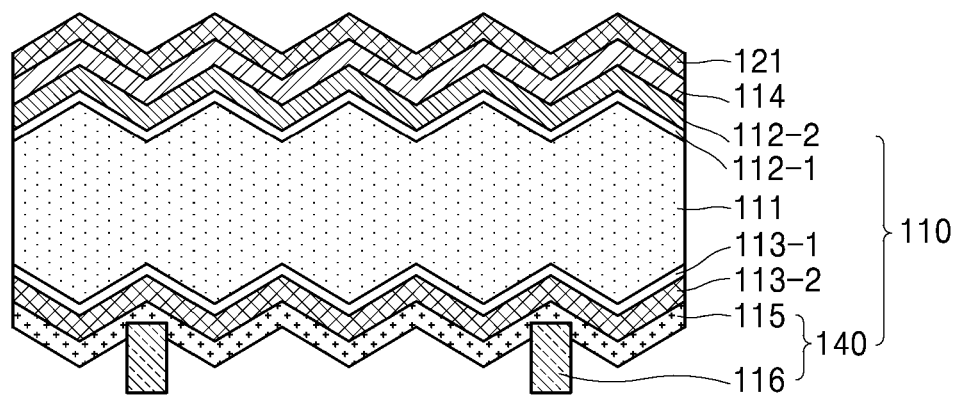

In the perovskite solar cell 120 and the tandem solar cell 100 including the same of the present disclosure, a first conduction-type charge transport layer 121 is formed on the intermediate layer 114 (see FIG. 10).

When the first conduction-type charge transport layer 121 is an electron transport layer, the first conduction-type charge transport layer 121 is manufactured by the PECVD process described above using one or more gases selected from the group consisting of $SiH_4$, $Si_2H_6$, $SiHCl_3$, and $SiH_2Cl_2$, $H_2$ gas, and $B_2H_6$ or $PH_3$ gas as a dopant gas as reactants. In this case, temperature and pressure conditions of the PECVD process are the same as those of the PECVD process of the amorphous intrinsic silicon layer. Therefore, an N-type amorphous silicon (n-a-Si) is deposited on the first conduction-type charge transport layer 121 of the present disclosure under the above process conditions.

Of course, alternatively, when the first conduction-type charge transport layer 121 in the present disclosure is an electron transport layer, the first conduction-type charge transport layer 121 may include a mixture of two or more of $TiO_2$, ZnO, $SnO_2$, CdS, PCBM, and C60. Among the above materials, in the case of C60, in the present disclosure, it is not preferable to use a solution method such as a generally known spin coating method. This is because it is difficult for the first conduction-type charge transport layer 121 formed by the solution method to have a shape conforming to the substrate having a lower texture.

On the other hand, when the first conduction-type charge transport layer 121 is a hole transport layer, the first conduction-type charge transport layer 121 is manufactured by the PECVD process described above using one or more gases selected from the group consisting of $SiH_4$, $Si_2H_6$, $SiHCl_3$, and $SiH_2Cl_2$, $H_2$ gas, and $B_2H_6$ gas as a dopant gas as reactants. In this case, a temperature and pressure conditions of the PECVD process are the same as those of the PECVD process of the amorphous intrinsic silicon layer. Therefore, a P-type amorphous silicon (p-a-Si) is deposited on the first conduction-type charge transport layer 121 of the present disclosure under the above process conditions.

Figure 11:
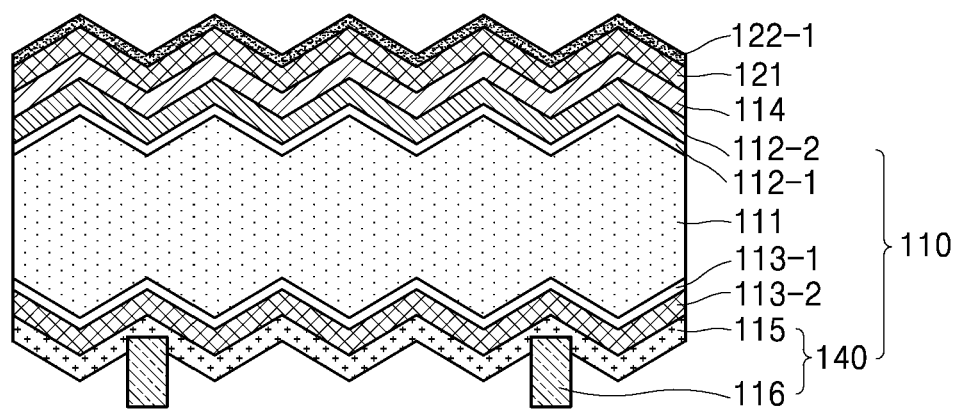
Figure 12:
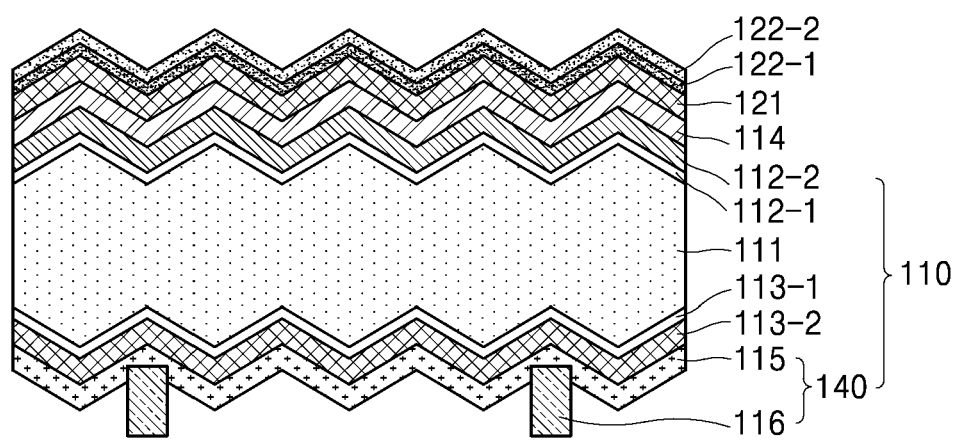

Next, a perovskite absorbing layer 122 is formed on the first conduction-type charge transport layer 121 (see FIGS. 11 and 12).

Specifically, in the present disclosure, first, an inorganic seed layer 122-1 conforming to the textured substrate is deposited on the textured first conduction-type charge transport layer 121 by sputtering (see FIG. 11).

The deposition of the inorganic seed layer 122-1 in the embodiment of the present disclosure is accomplished by forming an inorganic seed layer of a PbO component on the textured first conduction-type charge transport layer 121 by sputtering. Of course, in addition to the PbO target, it is possible to use one PbO target doped with $Cs_2O$ or a co-target of $Cs_2O$ and PbO. Further, in addition to the PbO target, the inorganic seed layer 122-1 has a BO structure, and in B, a component made of one or more of $Pb^{2+}$, $Sn^{2+}$, $Cu^{2+}$, $Ca^{2+}$, $Sr^{2+}$, $Cd^{2+}$, $Ni^{2+}$, $Mn^{2+}$, $Fe^{2+}$, $Co^{2+}$, $Pd^{2+}$, $Ge^{2+}$, $Yb^{2+}$, and $Eu^{2+}$ is also substitutable.

Specifically, in the sputtering process, the deposition is performed using the target of the PbO component under conditions of a pressure of 0.1 to 20 mTorr of an inert gas of Ar, He, or Ne, and power of 100 to 300 W, and in this case, the temperature of the substrate is maintained at a range of room temperature to 100° C. Further, since the component of the target is not a metal, RF sputtering using RF is used.

Meanwhile, forming the inorganic seed layer having porosity may be more advantageous than forming the perovskite absorbing layer. This is because, in a subsequent process of supplying organic halides, the organic halides react with the inorganic seed layer so that perovskite crystals are formed, and in this case, conversion to the perovskite crystals is difficult and time-consuming when the inorganic seed layer is too dense, and in more severe cases, the converted perovskite crystals may be thermally decomposed. However, it is not necessary that the inorganic seed layer in the present disclosure has porosity.

When the pressure of the gas is 1 mTorr or less, the sputtered particles reach the substrate and collide with the inert gas less, and as a result, it is difficult to form a porous film because the velocity and kinetic energy of the deposition component particles moving onto the substrate are excessively large. On the other hand, when the pressure of the gas is greater than 20 mTorr, the sputtered particles do not go straight due to collisions with the inert gas and are scattered in severe cases, and as a result, there is a problem in that the film is porous but the deposition rate is excessively slow.

In addition, when the electric power is 100 W or less, a porous film is obtained but there is a disadvantage in that the deposition rate is excessively small because the velocity and kinetic energy of the sputtered particles are excessively small. On the other hand, when the electric power is 300 W or more, there is a problem in that a porous film is difficult to form because the velocity and kinetic energy of the sputtered particles are excessively large.

Meanwhile, when other process conditions are the same, it is preferable that the substrate have a temperature which is as low as possible. This is because, as the temperature of the substrate decreases, the sputtered particles on the substrate do not have enough heat energy to provide enough mobility to move the next sputtered particles to a stable position before reaching the substrate so that the formed film is likely to become a porous film.

After the inorganic seed layer is formed, the process of supplying the organic halides thereon is performed (see FIG. 12). In this case, the organic halide is an A'X composition, wherein A' denotes +1 monovalent organic ammonium or organic amidinium, and X denotes halogen ions.

In the present disclosure, in one embodiment, a second precursor layer having a mixed composition of $CH(NH_2)_2I + CH(NH_2)_2Br$ is formed on the PbO layer. Of course, in addition to the above component, the organic halide layer 122-2 may be made of one or two or more of a +1 monovalent $C_{1-20}$ alkyl group, an amine group substituted alkyl group, organic amidium, or alkali metal not included in the inorganic seed layer, and the organic halide layer 122-2 may also be formed of a component composed of at least one of $F^-$, $Cl^-$, $Br^-$, and $I^-$.

The organic halide may be supplied using a method, for example, any one of an evaporation method, a CVD method, a PVD method, and a vapor annealing method other than a solution method.

In the present disclosure, as illustrated in FIG. 3, heat treatment is performed using a furnace in a $(FAI)_y/(FABr)_{1-y}$ atmosphere by a vapor annealing method, and as a result, the generated perovskite absorbing layer 122 of a composite composition has a composition of $FAPbI_yBr_{3-y}$.

Meanwhile, as described above, after the process of supplying the organic halides, heat treatment using polar solvents, such as DMF, NMP, DMSO, and GBL, may be optionally additionally performed as necessary.

Figure 13:
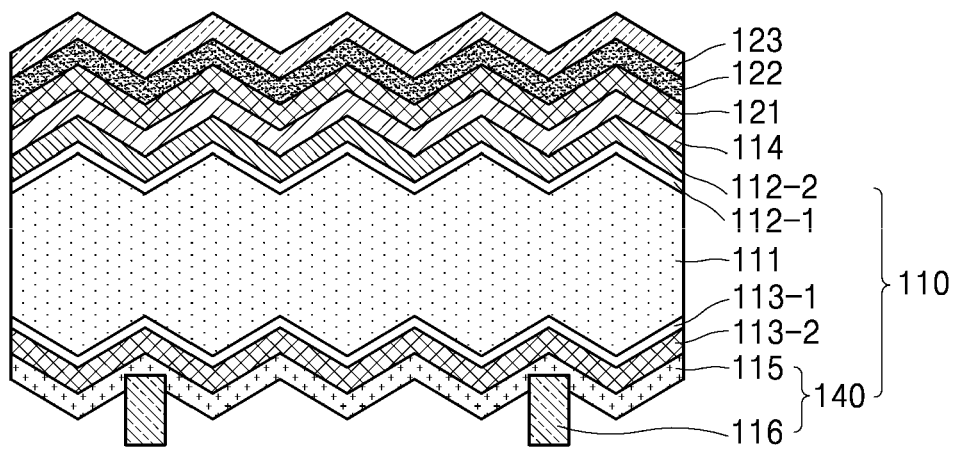

Next, as illustrated in FIG. 13, a second conduction-type charge transport layer 123 is formed on the perovskite absorbing layer 122. As described above, the second conduction-type charge transport layer 123 has a conduction type having polarity opposite to that of the first conduction-type charge transport layer 121.

Figure 14:
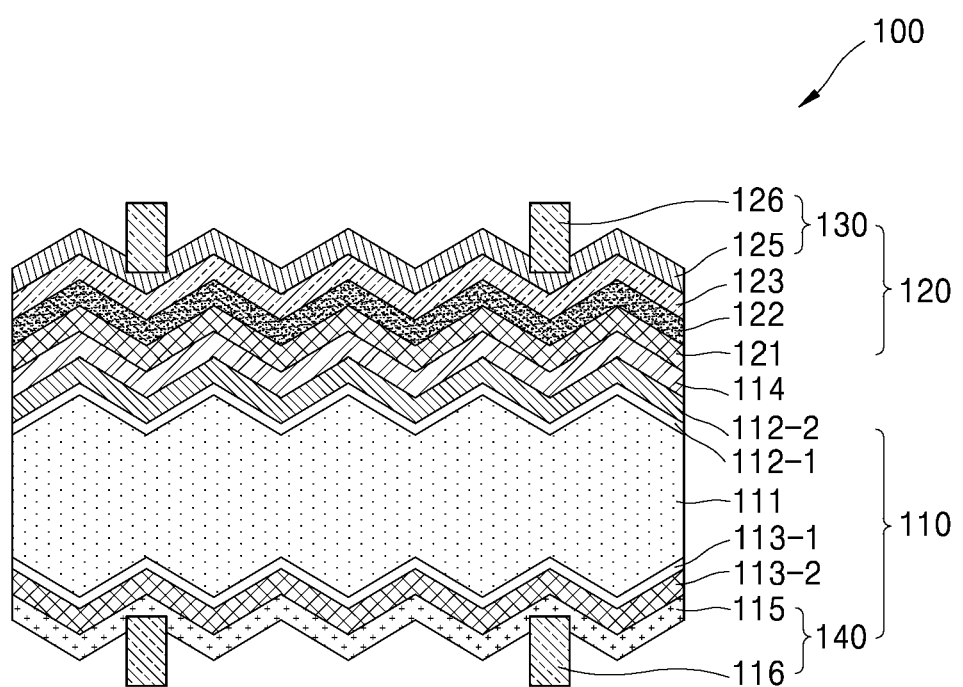

As described above, in the present disclosure, after the second conduction-type charge transport layer 123 is formed, a front transparent electrode 125 for the second electrode 130 is formed (see FIG. 14).

In this case, the transparent electrode layer 125 is formed on an entirety of an upper surface of the perovskite solar cell 120 and serves to collect electric charges generated in the perovskite solar cell 120. The transparent electrode layer 125 may be implemented as various transparent conductive materials. That is, as the transparent conductive material, the same material as the transparent conductive material of the intermediate layer 114 may be used.

In this case, a grid electrode 126 of the second electrode 130 is disposed on the front transparent electrode layer 125 and disposed on a part of the transparent electrode layer 125.

The grid electrode 126 of the second electrode 130 may be manufactured by selectively applying the first electrode paste not containing a glass frit and then by low-temperature sintering the glass frit at a first temperature. Here, the first electrode paste may include metal particles and an organic material that is a binder for low-temperature sintering, and the first electrode paste does not include a glass frit. In particular, the first temperature may be 250° C. or less, and more specifically, may range from 100 to 200° C.

As described above, the grid electrode 116 of the first electrode 140 may be formed at the same time when the grid electrode 126 of the second electrode 130 is formed, or the grid electrode 126 of the second electrode 130 may be formed after the perovskite solar cell is formed after the grid electrode 116 of the first electrode 140 is formed. Meanwhile, when the grid electrode 116 of the first electrode 140 and the grid electrode 126 of the second electrode 130 are formed simultaneously, both of the grid electrode 116 of the first electrode 140 and the grid electrode 126 of the second electrode 130 are formed by low-temperature sintering at a temperature of 250° C. or less.

As described above, while the present disclosure has been described with reference to the exemplified drawings, the present disclosure is not limited by the embodiments disclosed in the present disclosure and the drawings. It is clear to those skilled in the art that various modifications may be made without departing from the spirit and scope of the present disclosure. In addition, although the operation effect according to the configuration of the present disclosure has not been explicitly described while describing the embodiments of the present disclosure, it is natural that the predictable effect arising from the configuration should also be recognized.

The invention claimed is:

1. A method of manufacturing a solar cell, the method comprising:
    forming, on a substrate, an inorganic seed layer conforming to the substrate using a BO source, an A-doped BO source, or an $A_xO_y$ source and the BO source, where A denotes an alkali metal, B denotes a divalent metal cation, and O denotes oxygen; and
    supplying organic halides onto the inorganic seed layer.

2. The method of claim 1, wherein:
    the source is a target; and
    the forming of the inorganic seed layer is accomplished by sputtering.

3. The method of claim 1, wherein the forming of the inorganic seed layer is accomplished by chemical vapor deposition (CVD) or atomic layer deposition (ALD).

4. The method of claim 1, wherein a thickness of the inorganic seed layer ranges from 10 to 200 nm.

5. The method of claim 1, wherein the organic halide is an A'X composition, where A' denotes +1 monovalent organic ammonium or organic amidinium, and X denotes halogen ions.

6. The method of claim 1, wherein the supplying of the organic halides is accomplished by any one of an evaporation method, a physical vapor deposition (CVD) method, a physical vapor deposition (PVD) method, and a vapor annealing method.

7. The method of claim 1, wherein the supplying of the organic halides is performed at a substrate temperature of 25 to 200° C. for 120 minutes or less.

8. The method of claim 1, wherein the supplying of the organic halides includes supplying the organic halides and converting the organic halides into a perovskite absorbing layer by reaction with the inorganic seed layer.

9. The method of claim 1, further comprising converting the organic halides into a perovskite absorbing layer after the supplying of the organic halides.

10. The method of claim 9, wherein a thickness of the perovskite absorbing layer ranges from 50 to 1,000 nm.

11. The method of claim 10, wherein the perovskite absorbing layer includes $FA_{1-x}Cs_xPbBr_yI_{3-y}$, where, $0 \leq x \leq 1$, $0 \leq y \leq 3$.

12. The method of claim 1, further comprising performing post-heat treatment after the supplying of the organic halides.

13. The method of claim 12, wherein the post-heat treatment is solvent treatment and is performed at a temperature of 80 to 200° C. for 120 minutes or less.

14. The method of claim 9, further comprising:
    forming a first conduction-type charge transport layer before the inorganic seed layer is formed; and
    forming a second conduction-type charge transport layer after the supplying of the organic halides or the converting the organic halides into the perovskite absorbing layer.

15. The method of claim 1, wherein the solar cell includes:
    a first solar cell serving as a lower solar cell; and
    a perovskite solar cell serving as an upper solar cell, and
    a bandgap of the first solar cell is smaller than a bandgap of the perovskite solar cell.

16. The method of claim 1, wherein:
    the solar cell includes a silicon solar cell serving as a lower solar cell, and
    a perovskite solar cell serving as an upper solar cell, and
    the silicon solar cell includes a substrate,
    a first conduction layer located on a first surface of the substrate, and
    a second conduction layer located on a second surface of the substrate.

17. The method of claim 16, wherein the silicon solar cell includes:
    a first passivation layer located between the substrate and the first conduction layer; and
    a second passivation layer located between the substrate and the second conduction layer.

18. The method of claim 16, wherein the substrate and the first conduction layer have the same semiconductor conduction type.

19. The method of claim 16, wherein the substrate and the second conduction layer have the same semiconductor conduction type.

20. The method of claim 1, wherein the inorganic seed layer is a porous layer.

* * * * *